United States Patent
Lee et al.

(10) Patent No.: US 9,024,180 B2
(45) Date of Patent: May 5, 2015

(54) PARALLEL-TYPE TANDEM ORGANIC SOLAR CELL

(75) Inventors: Kwanghee Lee, Gwangju (KR); Junghwan Kim, Gwangju (KR); Sung-Heum Park, Gwangju (KR)

(73) Assignee: Gwangju Institute of Science and Technology, Buk-Gu, Gwangju (KR)

( * ) Notice: Subject to any disclaimer, the term of this patent is extended or adjusted under 35 U.S.C. 154(b) by 229 days.

(21) Appl. No.: 13/378,272

(22) PCT Filed: Sep. 29, 2010

(86) PCT No.: PCT/KR2010/006620
§ 371 (c)(1),
(2), (4) Date: Dec. 14, 2011

(87) PCT Pub. No.: WO2011/040750
PCT Pub. Date: Apr. 7, 2011

(65) Prior Publication Data
US 2012/0097230 A1    Apr. 26, 2012

(30) Foreign Application Priority Data

Sep. 29, 2009  (KR) .................. 10-2009-0092304

(51) Int. Cl.
*H01L 31/00* (2006.01)
*H01L 27/30* (2006.01)
*H01L 51/00* (2006.01)
*H01L 51/42* (2006.01)

(52) U.S. Cl.
CPC ........... *H01L 27/302* (2013.01); *H01L 51/0036* (2013.01); *H01L 51/0037* (2013.01); *H01L 51/4226* (2013.01); *H01L 51/4273* (2013.01); *H01L 2251/308* (2013.01)

(58) Field of Classification Search
USPC ....................................... 136/263
See application file for complete search history.

(56) References Cited

U.S. PATENT DOCUMENTS

2005/0217722 A1* 10/2005 Komatsu et al. ............... 136/263
2006/0138453 A1*  6/2006 Thompson et al. .......... 257/183

(Continued)

FOREIGN PATENT DOCUMENTS

CN    101076904 A    11/2007
JP    2002042863 A    2/2002

(Continued)

*Primary Examiner* — Matthew Martin
(74) *Attorney, Agent, or Firm* — Nath, Goldberg & Meyer; Jerald L. Meyer; Tiffany A. Johnson

(57) ABSTRACT

Provided is a parallel-type tandem organic solar cell. The parallel-type tandem organic solar cell includes: a first electrode; a first photoactive layer formed on the first electrode; a conductive polymer electrode formed on the first photoactive layer; a second photoactive layer formed on the conductive polymer electrode; a second electrode formed on the second photoactive layer; and a connection unit oriented in the direction ranging from the second electrode toward the first electrode so as to electrically connect the first electrode and the second electrode. According to the present invention, the energy conversion efficiency of the cell is improved by the increased photocurrent. Further, the solar cell of the present invention is advantageous in that an intermediate electrode can be made from solution-processable conductive polymers, and each element of the solar cell has a parallel structure, thereby simplifying manufacturing processes and reducing manufacturing costs.

8 Claims, 5 Drawing Sheets

(56) References Cited

U.S. PATENT DOCUMENTS

2007/0289626 A1* 12/2007 Brabec et al. ................ 136/263
2008/0295889 A1* 12/2008 Schindler et al. ............. 136/263
2009/0044855 A1*  2/2009 Irwin et al. .................... 136/255

FOREIGN PATENT DOCUMENTS

| JP | 2005175131 A | 6/2005 |
| JP | 2006012802 A | 1/2006 |

* cited by examiner

PARALLEL-TYPE TANDEM ORGANIC SOLAR CELL

This is a National Phase Application filed under 35 U.S.C. §371 as a national stage of PCT/KR 2010/006620, filed on Sep. 29, 2010, an application claiming the benefit under 35 U.S.C. §119 of Korean Patent Application No. 10-2009-0092304, filed on Sep. 29, 2009, the content of each of which is hereby incorporated by reference in its entirety.

TECHNICAL FIELD

The present invention relates to a parallel-type tandem organic solar cell and, more particularly, to an organic solar cell which includes unit cells stacked and connected in parallel to improve energy conversion efficiency.

BACKGROUND ART

As development of alternative clean energy has attracted attention in the face of environmental issues and high oil prices, extensive studies have been conducted to develop improved solar cells. Organic solar cells have various advantages since they can be made slim and thin due to a high absorption coefficient of organic molecules used for photoactive layers, require a simple manufacturing process and low equipment cost, and are applicable to various fields due to good bending property and processibility of polymers. However, since electric charges have short lifetime, low mobility and a short spreading distance due to high charge trap density, organic solar cells have low light collection efficiency and low energy conversion efficiency.

Since energy conversion efficiency is an important factor in determining performance and price of a solar cell, a variety of technologies have been developed to improve efficiency of solar cells in view of various aspects. In one method of realizing a solar cell having high energy conversion efficiency, two or more unit cells each having a photoactive layer are connected in parallel to increase photocurrent while maintaining open-circuit voltage.

Representative solar cells having unit cells connected in parallel are reported by A. Hadipour et al. [J. Appl. Phys. 102, 074506] and V. Shrotriya et al. [Appl. Phys. Lett 88, 064104]. However, such solar cells require several high-degree vacuum depositions to form metal electrodes in each unit cell and employ a process of connecting the electrodes in parallel through an external wire. In this case, the unit cells can have increased photocurrent, but require complicated processes and long time in manufacture, thereby causing an increase in manufacturing costs of unit cells.

DISCLOSURE

Technical Problem

The present invention is directed to solving such problems of the related art and provides a parallel-type tandem organic solar cell that has improved photocurrent generation efficiency and is manufactured through a simple process.

Technical Solution

In accordance with an aspect of the present invention, a parallel-type tandem organic solar cell is provided. The parallel-type tandem organic solar cell includes a first electrode, a first photoactive layer formed on the first electrode, a conductive polymer electrode formed on the first photoactive layer, a second photoactive layer formed on the conductive polymer electrode, a second electrode formed on the second photoactive layer, and a connection unit oriented in the direction ranging from the second electrode toward the first electrode so as to electrically connect the first electrode and the second electrode.

The first electrode and the second electrode may be cathodes and the conductive polymer electrode may be an anode.

The first electrode and the second electrode may be anodes and the conductive polymer electrode may be a cathode.

A polymer material of the conductive polymer electrode may include at least one of polyethylenedioxythiophene (PEDOT), polystyrenesulfonate, polyacetylene, polypyrrole, polythiophene and polyaniline.

The connection unit may be formed of the same material as that of the second electrode.

The parallel-type tandem organic solar cell may further include at least one of an n-type buffer layer disposed between the first electrode and the first photoactive layer, and an n-type buffer layer disposed between the second photoactive layer and the second electrode.

The parallel-type tandem organic solar cell may further include at least one of an n-type buffer layer disposed between the first photoactive layer and the conductive polymer electrode and an n-type buffer layer disposed between the conductive polymer electrode and the second photoactive layer.

The n-type buffer layers may include n-type metal oxides, for example, $TiO_x$, $ZnO$, $Cs_2CO_3$, or mixtures thereof.

The parallel-type tandem organic solar cell may further include at least one of a p-type buffer layer disposed between the first photoactive layer and the conductive polymer electrode and a p-type buffer layer disposed between the conductive polymer electrode and the second photoactive layer.

The parallel-type tandem organic solar cell may further include at least one of a p-type buffer layer disposed between the first electrode and the first photoactive layer and a p-type buffer layer disposed between the second photoactive layer and the second electrode.

The p-type buffer layers may include a cured product of a mixture containing the polymer material of the conductive polymer electrode and a polar solvent or p-type metal oxides.

The p-type metal oxides may include $MoO_3$, $V_2O_5$, $NiO_x$ or mixtures thereof.

Advantageous Effects

According to exemplary embodiments, the organic solar cell may have improved energy conversion efficiency by increasing photocurrent. Further, an intermediate electrode may be made from solution-processable conductive polymers, and each element of the solar cell has a parallel structure, thereby simplifying manufacturing processes while reducing manufacturing costs.

MODE FOR INVENTION

Figure 1:
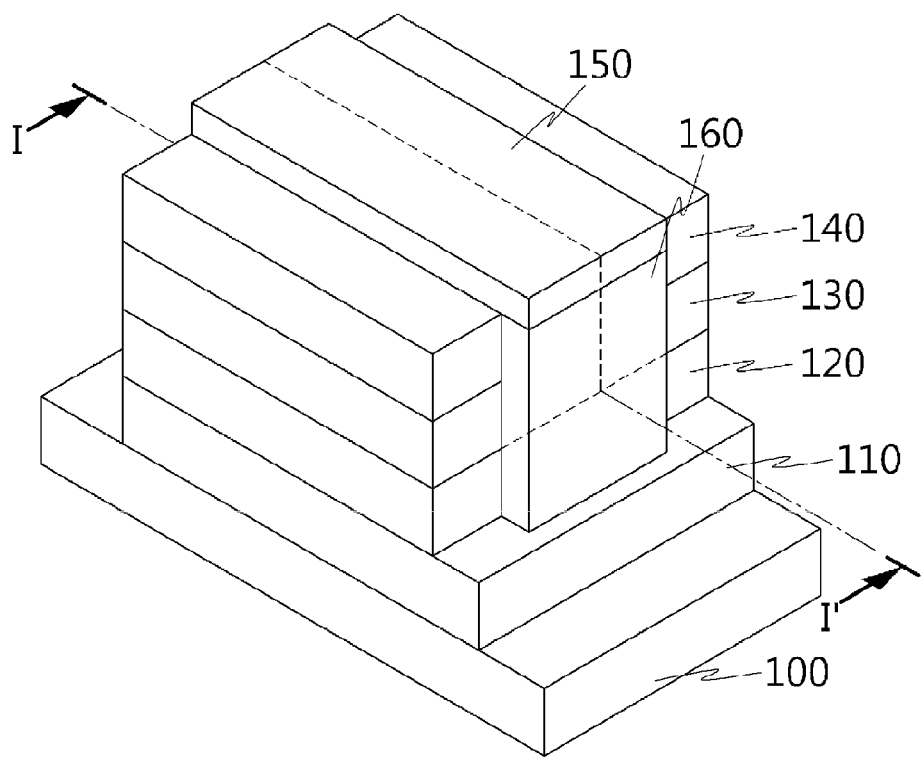
FIG. 1 is a perspective view of a parallel-type tandem organic solar cell according to one exemplary embodiment of the present invention.
Figure 2:
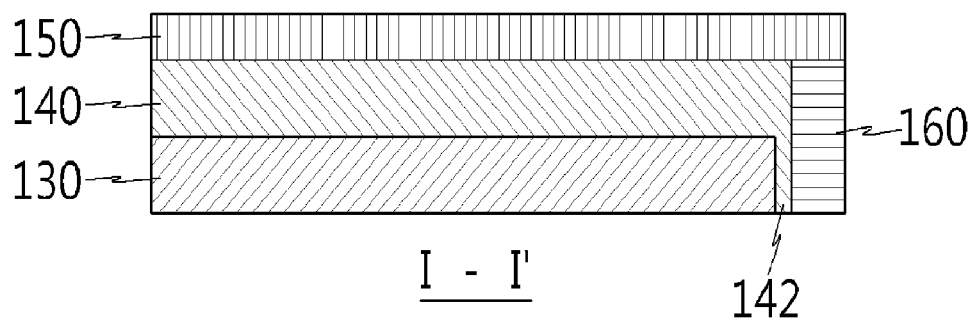
FIG. 2 is a partial sectional view of the parallel-type tandem organic solar cell according to the embodiment of the present invention.

Exemplary embodiments of the invention will now be described in detail with reference to the accompanying drawings. It should be understood that the present invention is not limited to the following embodiments and may be embodied in different ways, and that the embodiments are given to provide complete disclosure of the invention and to provide thorough understanding of the invention to those skilled in the art. The scope of the invention is limited only by the accompanying claims and equivalents thereof. Like reference numerals refer to like elements throughout FIG. 1 is a perspective view of a parallel-type tandem organic solar cell according to one exemplary embodiment of the present invention, and FIG. 2 is a partial sectional view of the stacked parallel organic solar cell. A partial section shown in FIG. 2 is taken along line I-I' of the solar cell in FIG. 1.

As shown in FIG. 1, the organic solar cell according to the embodiment includes a first electrode 110, a first photoactive layer 120, a conductive polymer electrode 130, a second photoactive layer 140 and a second electrode 150, which are sequentially stacked on a light transmitting substrate 100; and a connection unit 160 electrically connecting the first electrode 110 and the second electrode 150.

The light transmitting substrate 100 may be a glass substrate or a light transmitting resin substrate having a high light transmittance, such as of polyethylene terephthalate (PET), polystyrene, polycarbonate, polymethylmethacrylate, polyimide, and the like.

At least one of the first electrode 110 and the second electrode 150 may be a light transmitting electrode, and the first electrode 110 and the second electrode 150 may be formed of conductive materials having a low resistance. For example, the first electrode 110 may be a metal oxide transparent electrode, such as an indium tin oxide (ITO), fluoride-doped tin oxide (FTO), zinc oxide (ZnO), indium zinc oxide (IZO) or Al-doped zinc oxide (AZO) electrode, or be an electrode formed of a conductive polymer, carbon nanotube or graphene. However, the first electrode 110 is not limited to the above examples and may include any material having conductivity. The second electrode 150 may be the aforementioned metal oxide transparent electrodes or electrodes of aluminum (Al), gold (Au), silver (Ag), copper (Cu), carbon (C), carbon nanotube, a conductive polymer or combinations thereof. The first electrode 110 and the second electrode 150 may be formed of materials having a lower work function than HOMO energy of the conductive polymer electrode 130, thus forming a cathode.

The first photoactive layer 120 and the second photoactive layer 140 may be formed of electron donor D and electron acceptor A materials, serving as photoelectric conversion layers that separate excitons, generated from the electron donor materials in light, into electrons and holes to generate current. Here, the electron donor materials of the first photoactive layer 120 and the second photoactive layer 140 may be independently and suitably selected from polymer organic semiconductor compounds or low molecular weight organic semiconductor compounds. In particular, when the first photoactive layer 120 and the second photoactive layer 140 are made of materials having different light absorption ranges respectively, the light absorption range of the cell is extended overall, thus improving energy conversion efficiency.

The polymer organic semiconductor compounds may include poly(3-hexylthiophene) (P3HT), poly[2,6-(4,4-bis-(2-ethylhexyl)-4H-cyclopenta[2,1-b;3,4-b']dithiophene)-alt-4,7-(2,1,3-benzothiadiazole)] (PCPDTBT), poly[N-9"-hepta-decanyl-2,7-carbazole-alt-5,5-(4',7'-di-2-thienyl-2',1', 3'-benzothiadiazole)] (PCDTBT), poly(2,7-(9-(2'-ethylhexyl)-9-hexyl-fluorene)-alt-5,5-(4',7'-di-2-thienyl-2', 1',3'-benzothiadiazole)) (PFDTBT), poly-[2-methoxy-5-(2'-ethyl-hexyloxy)-1,4-phenylene vinylene] (MEH-PPV), poly [2methoxy-5-(3,7-dimethyloctyloxy)-1,4-phenylene vinylene] (MDMO-PPV), poly[(4,4-didodecyldithieno[3,2-b:2',3'-d]silole)-2,6-diyl-alt-(2,1,3-benzothiadiazole)-4,7-diyl] (SDT-BT), or the like. The low molecular weight organic semiconductor compounds may include copper phthalocyanine (CuPc), zinc phthalocyanine (ZnPc), (2,3,7, 8,12,13,17,18-octaethyl-21H,23H-porphyrin)platinum(II) (PtOEP), or the like. However, the organic semiconductor compounds are not limited thereto.

The electron acceptor materials of the first photoactive layer 120 and the second photoactive layer 140 may include fullerene ($C_{60}$), (6,6)-phenyl-$C_{61}$-butyric acid methyl ester (PCBM), which is fullerene modified to be suitably dissolved in organic solvents, (6,6)-phenyl-$C_{70}$-butyric acid methyl ester (PC$_{70}$BM), and monomers including perylene, polybenzimidazole (PBI) and 3,4,9,10-perylene-tetracarboxylic bisbenzimidazole (PTCBI), without being limited thereto.

The conductive polymer electrode 130 is a transparent and electroconductive electrode, functioning as an anode, which collects holes generated from the first photoactive layer 120 and the second photoactive layer 140. The conductive polymer electrode 130 may include polyethylenedioxythiophene (PEDOT), polyacetylene, polypyrrole, polythiophene and polyaniline, preferably polyethylenedioxythiophene polystyrenesulfonate (PEDOT:PSS). However, the conductive polymer electrode 130 is not limited to the above materials and may include any transparent and electroconductive polymer. To improve characteristics of the conductive polymer electrode 130, additives may be introduced into the above listed polymer materials. For example, when the conductive polymer electrode 130 is formed of PEDOT:PSS, a polar aprotic solvent, for example dimethyl sulfoxide (DMSO), is introduced as an additive to improve electrical conductivity.

The conductive polymer electrode 130 may be formed by a solution process using casting, spin coating, spray coating, ink-jet printing, screen printing, a doctor blade or a slot-die.

The connection unit 160 is a part that electrically connects the first electrode 110 and the second electrode 150 and has an oriented structure in a direction from the first electrode 110 to the second electrode 150.

For example, the connection unit 160 may be formed as follows. The first photoactive layer 120, the conductive polymer electrode 130 and the second photoactive layer 140 (and a buffer layer if included) are stacked on the first electrode 110, with an upper side of the first electrode 140 being partially exposed. Then, in the process of forming the second electrode 150 on the second photoactive layer 140, the material of the second electrode 150 is also deposited or applied to the exposed upper side of the first electrode 110. Here, the material of the second electrode 150 is deposited to a sufficient height (thickness) on the exposed upper side of the first electrode while being connected to one end of the second electrode 150 formed in parallel with the first electrode 110. As a result, the connection unit 160 may be made of the same material as the second electrode 150.

As described above, the connection unit 160 may be formed simultaneously with formation of the second electrode. As the connection unit 160 is formed, the first electrode 110 and the second electrode 150 are electrically connected, and thus the cell may be autonomously constituted in a parallel structure without connecting a conducting wire to the outside.

Figure 3:
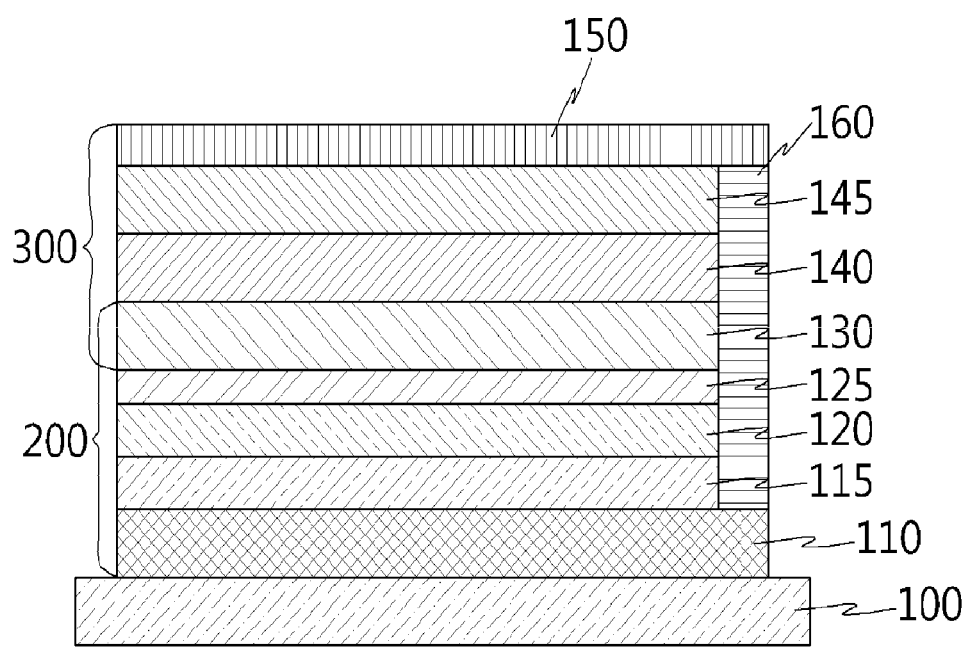
FIG. 3 is a sectional view of a parallel-type tandem organic solar cell manufactured according to one exemplary embodiment of the present invention.

As shown in FIG. 2, while forming the second photoactive layer 140, the material of the second photoactive layer 140 is applied to cover a lateral side of the conductive polymer electrode 130, thereby forming a layer 142 having a certain thickness between the lateral side of the conductive polymer electrode 130 and the connection unit 160 (however, the layer 142 is not shown in FIGS. 1 and 3). Thus, it is possible to prevent a short circuit due to direct contact between the connection unit 160 and the lateral side of the conductive polymer electrode 130. Further, when a buffer layer is adopted between the second photoactive layer 140 and the second electrode 150, a layer of a material forming the buffer layer may be formed in the same manner between the lateral side of the conductive polymer electrode 130 and the connection unit 160. Therefore, a short circuit problem may be spontaneously solved while manufacturing the cell. In addition, the lateral side of the conductive polymer electrode 130 is coated with a thin insulating material (passivation), thereby preventing a short circuit, which can occur due to contact of the connection unit 160 with the lateral side of the conductive polymer electrode 130.

Further, the parallel-type tandem organic solar cell according to this embodiment may include various buffer layers among the electrodes 110, 130 and 150 and the photoactive layers 120 and 140. The buffer layers may be suitably selected based on desired purposes in consideration of cell efficiency and materials as follows.

The solar cell may further include at least one of an n-type buffer layer 115 disposed between the first electrode 110 and the first photoactive layer 120 and an n-type buffer layer 145 disposed between the second photoactive layer 140 and the second electrode 150. The n-type buffer layers 115, 145 refer to layers functioning as electron transfer layers (ETLs) which allow electrons generated in adjacent photoactive layers to be readily transferred to adjacent electrodes. Further, the n-type buffer layers 115, 145 may serve as hole blocking layers (HBLs) which prevent holes generated in adjacent photoactive layers from being injected into adjacent electrodes. The n-type buffer layers 115, 145 may be formed of materials including aluminum tris(8-hydroxyquinoline) (Alq3), lithium fluoride (LiF), 8-hydroxyquinolinato lithium (Liq), polymer materials, or n-type metal oxides. Examples of the n-type metal oxides may include $TiO_x$, ZnO, $Cs_2CO_3$, or mixtures thereof. However, materials forming the n-type buffer layers are not limited thereto.

The solar cell may further include at least one of a p-type buffer layer 125 disposed between the first photoactive layer 120 and the conductive polymer electrode 130 and a p-type buffer layer 135 disposed between the conductive polymer electrode 130 and the second photoactive layer 140. The p-type buffer layers 125, 135 refer to layers serving as hole transfer layers (HTLs) which allow holes generated in adjacent photoactive layers to be readily transferred to the adjacent conductive polymer electrode 130. In one example, the p-type buffer layers 125, 135 may be formed of materials including MTDATA, TDATA, NPB, PEDOT:PSS, TPD, or p-type metal oxides. Examples of the p-type metal oxides may include $MoO_3$, $V_2O_5$, $NiO_x$, or mixtures thereof. However, the p-type buffer layers are not limited to the above materials.

In addition to the function of accelerating separation or transfer of electric charges as described above, the buffer layers may also serve to improve interfacial properties between adjacent layers in the cell. For example, when forming the conductive polymer electrode 130 of hydrophilic materials on the first photoactive layer 120 of hydrophobic materials, it is very difficult to obtain the conductive polymer electrode 130 in a uniform film shape due to different properties of the materials. In this case, if a cured product of a mixture containing a polymer material of the conductive polymer electrode 130 and a polar solvent is adopted as a p-type buffer layer on the first photoactive layer 120, the conductive polymer electrode 130 may be formed in a uniform film shape on the p-type buffer layer.

Alternatively, the parallel-type tandem organic solar cell may include the first electrode 110 and the second electrode 150, which are configured as anodes, and the conductive polymer electrode 130 as a cathode. In this case, the conductive polymer electrode 130 is subjected to proper chemical treatment, for example n-doping, to adjust the energy level of the conductive polymer electrode 130, particularly the LUMO level, thus functioning as a cathode. Further, in consideration of efficient transfer of electric charges and properties of materials, the aforementioned buffer layers may be adopted. In this case, the buffer layers may include at least one of a p-type buffer layer disposed between the first electrode 110 and the first photoactive layer 120 and a p-type buffer layer disposed between the second photoactive layer 140 and the second electrode 150 and at least one of an n-type buffer layer disposed between the first photoactive layer 120 and the conductive polymer electrode 130 and an n-type buffer layer disposed between the conductive polymer electrode 130 and the second photoactive layer 140.

Hereinafter, the present invention will be described in more detail with reference to the following examples. These examples are provided for illustrative purposes only and are not to be in any way construed as limiting the present invention.

Preparation Example

Preparation of Parallel-Type Tandem Organic Solar Cell

FIG. 3 is a sectional view of a parallel-type tandem organic solar cell manufactured according to one exemplary embodiment of the invention.

As shown in FIG. 3, a first electrode 110, an n-type buffer layer 115, a first photoactive layer 120, a p-type buffer layer 125 and a conductive polymer electrode 130 were sequentially stacked on a glass substrate 100, thereby forming a lower unit cell 200. Then, a second photoactive layer 140, an n-type buffer layer 145 and a second electrode 150 were sequentially stacked on the conductive polymer electrode 130, thereby forming an upper unit cell 300. Further, a connection unit 160 connecting the first electrode 110 and the second electrode 150 was formed simultaneously with formation of the second electrode 150.

Specifically, the first electrode 110 was an ITO electrode, and the n-type buffer layers 115 and 145 were formed of $TiO_x$. The photoactive layers 120 and 140 were formed of P3HT:PCBM, the p-type buffer layer 125 was formed of a mixture containing PEDOT:PSS and isopropyl alcohol (IPA), and the conductive polymer electrode 130 was formed of PEDOT:PSS:DMSO (5%). The second electrode 150 and the connection unit 160 were formed of aluminum (Al).

Figure 4:
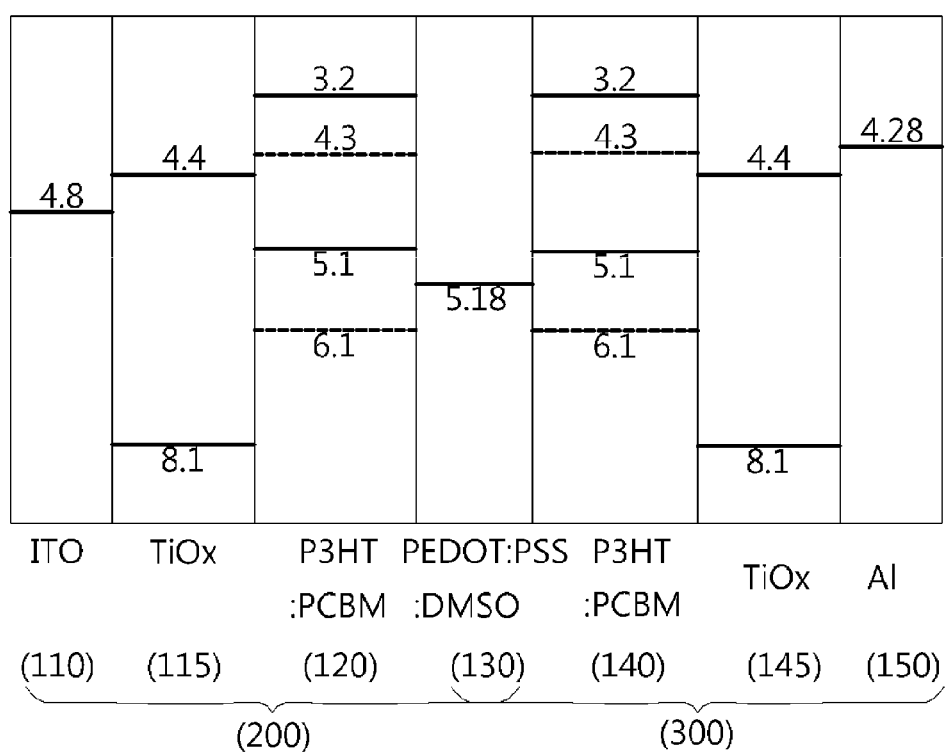
FIGS. 4 and 5 are energy diagrams of a parallel-type tandem organic solar cell according to Preparation Example in an open-circuit voltage state and in a short-circuit state.
Figure 5:
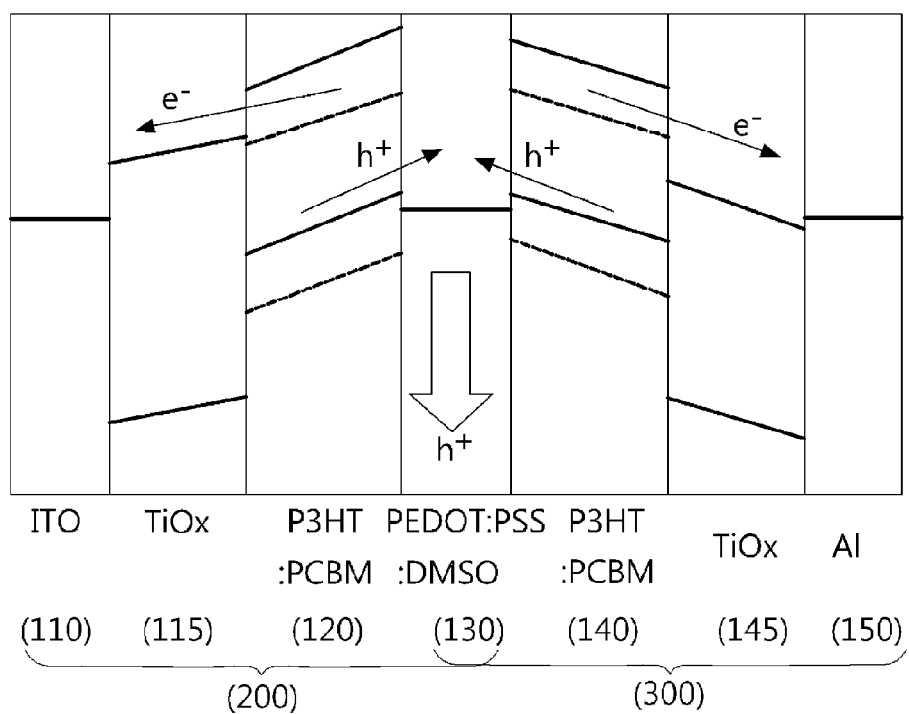

FIGS. 4 and 5 illustrate energy diagrams of a parallel-type tandem organic solar cell according to Preparation Example in an open-circuit voltage state and in a short-circuit state. However, the energy level of the p-type buffer layer 125 is the same as that of the conductive polymer electrode and thus is omitted in FIGS. 4 and 5.

Referring to FIGS. 4 and 5, the conductive polymer electrode 130 formed of PEDOT:PSS:DMSO having a high work function is adopted as an intermediate electrode to collect holes, and the first electrode (ITO electrode) 110 and the second electrode (Al electrode) 150 having a relatively low work function serve to collect electrons. Further, the $TiO_x$ buffer layers 115 and 145 were introduced into the cells to improve rectification properties of the cells. In particular, the $TiO_x$ buffer layer 115 formed on the first electrode (ITO electrode) 110 functions to form a high open-circuit voltage in the lower unit cell 200.

Preparation Example

Measurement of Efficiency of Parallel-Type Tandem Organic Solar Cell

The parallel-type tandem organic solar cell manufactured in Preparation Example was evaluated as to efficiency by irradiating light with an intensity of 100 mw/cm² at an air mass (AM) of 1.5 G.

Figure 6:
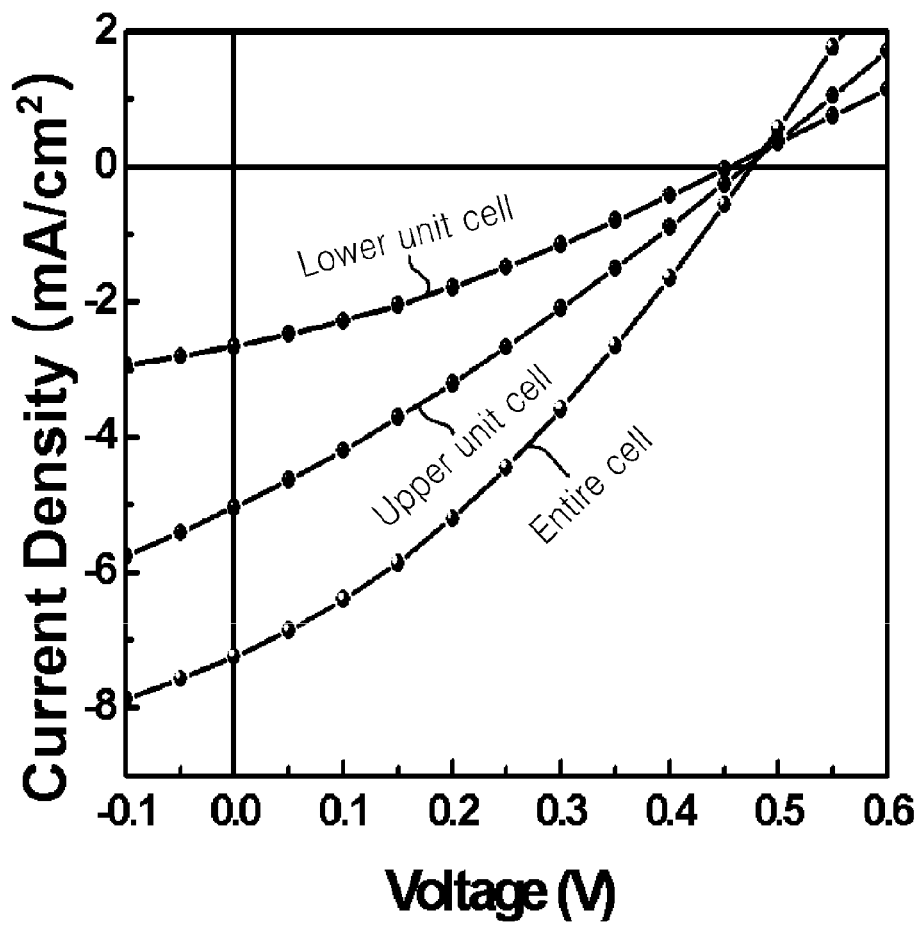
FIG. 6 is a graph of a current-voltage curve of the parallel-type tandem organic solar cell measured in Experimental Example.

FIG. 6 is a current-voltage curve of the parallel-type tandem organic solar cell measured in the Experimental Example.

Referring to FIG. 6, the sum of short-circuit current values of the lower unit cell and the upper unit cell which constitute the parallel-type tandem organic solar cell of the present invention is similar to the short-circuit current of the entire cell. Further, the open-circuit voltage of each of the unit cells is the same as the open-circuit voltage of the entire cell. This corresponds to a phenomenon whereby the same voltage is applicable to all resistors connected in parallel in a circuit and the total current is the sum of the currents through the individual resistors. Thus, the tandem organic solar cell according to the present invention is identified as having a parallel-connection structure.

Table 1 summarizes open-circuit voltage ($V_{oc}$), short-circuit current ($J_{sc}$), a fill factor (FF) and energy conversion efficiency (PCE) of the parallel-type tandem organic solar cell, measured in the Experimental Example.

TABLE 1

| | Voc (V) | Jsc (mA/cm²) | FF | PCE (%) |
|---|---|---|---|---|
| Lower unit cell | 0.46 | 2.66 | 0.31 | 0.37 |
| Upper unit cell | 0.47 | 5.04 | 0.28 | 0.67 |
| Entire cell | 0.47 | 7.25 | 0.32 | 1.11 |

Referring to Table 1, the parallel-type entire cell has improved energy conversion efficiency (PCE) as compared with each unit cell, for which electrons generated in the respective photoactive layers are collected by the ITO electrode and the Al electrode and gather in the connection unit and holes gather in the conductive polymer electrode to be discharged outside, thereby generating a greater amount of photocurrent.

In this example, the lower unit cell and the upper unit cell include the same photoactive layers. Alternatively, the photoactive layers may be formed of materials having different light absorption ranges, thereby extending the light absorption range of the entire cell. Further, by adjusting energy levels and work functions of materials forming the respective layers of the cell and adopting suitable buffer layers, the efficiency of the cell may be further improved.

As such, according to the exemplary embodiments, the respective unit cells are stacked and connected in parallel to increase photocurrent, thereby improving energy conversion efficiency. Here, connection of the cells in parallel may be realized by a structure of the cell without use of an external conducting wire. Further, the intermediate electrode is formed using solution-processable conductive polymers, thereby simplifying manufacturing processes while reducing manufacturing costs.

Although some embodiments have been disclosed herein, it should be understood that these embodiments are provided by way of illustration only, and that various modifications, changes, and alterations can be made without departing from the spirit and scope of the invention. Therefore, the scope of the invention should be limited only by the accompanying claims and equivalents thereof.

The invention claimed is:

1. A parallel-type tandem organic solar cell comprising:
   a first electrode;
   a first photoactive layer formed on the first electrode;
   a conductive polymer electrode formed on the first photoactive layer;
   a second photoactive layer formed on the conductive polymer electrode;
   a second electrode formed on the second photoactive layer;
   a first n-type buffer layer disposed between the first electrode and the first photoactive layer, wherein the first n-type buffer layer is arranged as a hole blocking layer so as to prevent holes generated in adjacent photoactive layers from being injected into adjacent electrodes;
   a first p-type buffer layer disposed between the first photoactive layer and the conductive polymer electrode;
   a second p-type buffer layer disposed between the conductive polymer electrode and the second photoactive layer;
   a second n-type buffer layer disposed between the second photoactive layer and the second electrode, wherein the second n-type buffer layer is arranged as a hole blocking layer so as to prevent holes generated in adjacent photoactive layers from being injected into adjacent electrodes; and
   a connection unit oriented in the direction ranging from the second electrode toward the first electrode so as to electrically connect the first electrode and the second electrode,
   wherein the connection unit is in contact with a lateral side of the first photoactive layer and a lateral side of the second photoactive layer,
   wherein the connection unit is formed of the same material as that of the second electrode, and
   wherein the second photoactive layer is formed between the conductive polymer electrode and the connection unit.

2. The solar cell of claim 1, wherein the first electrode and the second electrode are cathodes and the conductive polymer electrode is an anode.

3. The solar cell of claim 1, wherein the first electrode and the second electrode are anodes and the conductive polymer electrode is a cathode.

4. The solar cell of claim 1, wherein a polymer material of the conductive polymer electrode comprises at least one of polyethylenedioxythiophene (PEDOT), polystyrenesulfonate, polyacetylene, polypyrrole, polythiophene, and polyaniline.

5. The solar cell of claim 1, wherein the n-type buffer layers comprise n-type metal oxides.

6. The solar cell of claim 5, wherein the n-type metal oxides comprise $TiO_x$, $ZnO$, $Cs_2CO_3$, or mixtures thereof.

7. The solar cell of claim 1, wherein the p-type buffer layers comprise a cured product of a mixture containing the polymer material of the conductive polymer electrode and a polar solvent or p-type metal oxides.

8. The solar cell of claim 7, wherein the p-type metal oxides comprise $MoO_3$, $V_2O_5$, $NiO_x$ or mixtures thereof.

* * * * *